(12) United States Patent
Basol

(10) Patent No.: US 7,582,506 B2
(45) Date of Patent: Sep. 1, 2009

(54) PRECURSOR CONTAINING COPPER INDIUM AND GALLIUM FOR SELENIDE (SULFIDE) COMPOUND FORMATION

(75) Inventor: Bulent M. Basol, Manhattan Beach, CA (US)

(73) Assignee: Solopower, Inc., San Jose, CA (US)

( * ) Notice: Subject to any disclaimer, the term of this patent is extended or adjusted under 35 U.S.C. 154(b) by 212 days.

(21) Appl. No.: 11/621,101

(22) Filed: Jan. 8, 2007

(65) Prior Publication Data
US 2007/0166964 A1    Jul. 19, 2007

Related U.S. Application Data

(63) Continuation-in-part of application No. 11/081,308, filed on Mar. 15, 2005, now Pat. No. 7,374,963.

(60) Provisional application No. 60/756,750, filed on Jan. 6, 2006.

(51) Int. Cl.
H01L 21/00 (2006.01)
(52) U.S. Cl. .............. 438/95; 438/51; 438/57; 438/84; 438/479; 438/483; 257/E31.007
(58) Field of Classification Search .......... 438/59, 438/84
See application file for complete search history.

(56) References Cited

U.S. PATENT DOCUMENTS

| | | | |
|---|---|---|---|
| 4,581,108 A | 4/1986 | Kapur et al. | |
| 4,798,660 A | 1/1989 | Ermer et al. | |
| 5,436,204 A | 7/1995 | Albin et al. | |
| 5,489,372 A | 2/1996 | Hirano | |
| 5,501,786 A | 3/1996 | Gremion | |
| 5,567,469 A | 10/1996 | Gremion | |
| 5,695,627 A | 12/1997 | Nakazawa | |
| 5,730,852 A | 3/1998 | Bhattacharya | |
| 5,804,054 A | 9/1998 | Bhattacharya | |
| 5,871,630 A | 2/1999 | Bhattacharya | |
| 6,048,442 A | 4/2000 | Kushiya | |
| 6,092,669 A | 7/2000 | Kushiya et al. | |
| 6,258,620 B1 * | 7/2001 | Morel et al. | 438/57 |

OTHER PUBLICATIONS

Bhattacharya, R.N., et al., "$CuIn_{1-x}Ga_xSe_2$-based Photovoltaic Cells from Electrodeposited Precursor Films", *Solar Energy Mats & Solar Cells*, vol. 76, 2003, pp. 331-337.

(Continued)

*Primary Examiner*—Fernando L Toledo
*Assistant Examiner*—Kyoung Lee
(74) *Attorney, Agent, or Firm*—Pillsbury Winthrop Shaw Pittman LLP

(57) ABSTRACT

The present invention relates to systems and methods for preparing metallic precursor thin films for the growth of semiconductor compounds to be used for radiation detector and solar cell fabrication. In one aspect, there is provided a method of efficiently using expensive materials necessary for the making of solar cells.

8 Claims, 2 Drawing Sheets

OTHER PUBLICATIONS

Binsma, J.J., et al., "Preparation of Thin $CuInS_2$ Films via a Two Stage Process", *Thin Solid Films*, 97, 1982, pp. 237-243.

Calixto, M.E., et al., "$CuInSe_2$ Thin Films Formed by Selenization of Cu-In Precursors", *J. of Mats. Sci.*, 33, 1998, pp. 339-345.

Fernandez, et al., "Electroeposited and Selenized ($CuInSe_2$) (CIS) Thin Films for Photovoltaic Applications", *Solar Energy Materials and Solar Cells*, 52, 1998, pp. 423-431.

Friedfeld, R., et al., "Electrodeposition of $CuIn_xGa_1$-$xSe_2$ Thin Films", *Solar Energy Mats. & Solar Cells*, 58, 1999, pp. 375-385.

Fritz, H.P., et al., "A New Electrochemical Method for Selenization of Stacked CuIn Layers and Preparation of $CuInSe_2$ by Thermal Annealing", *Thin Solid Films*, 247, 1994, pp. 129-133.

Ganchev, M., et al., "Preparation of $Cu(In,Ga)Se_2$ Layers by Selenization of Electrodeposited Cu-In-Ga Precursors", *Thin Solid Films*, 511-512, 2006, pp. 325-327.

Grindle, S.P., et al., "Preparation and Properties of $CuInS_2$ Thin Films Produced by Exposing rf-Sputtered Cu-In Films to an $H_2S$ Atmosphere", *Appl. Phys. Lett*, 35(1) Jul. 1, 1979, pp. 24-26.

Guillen, C., et al., "New Approaches to Obtain $CuIn_{1-x}Ga_xSe_2$ Thin Films by Combining Electrodeposited and Evaporated Precursors", *Thin Solid Films*, 323, 1998, pp. 93-98.

Guillen, C.,et al., "$CuInSe_2$ Thin Films Obtained by a Novel Electrodeposition and Sputtering Combined Method," *Vacuum*, 58, 2000, pp. 594-601.

Gupta, A., et al., "$CuInS_2$ Films Prepared by Sulfurization of Electroless Deposited Cu-In Alloy", *Solar Energy Mats.*, 18, 1988, pp. 1-8.

Kampmann, A., et al., "Electrodeposition of CIGS on Metal Substrates", *Mat. Res. Soc. Symp. Proc.*, 763, 2003, pp. B8.5.1-B8.5.6.

Kapur, V.K., et al., "Low Cost Thin Film Chalcopyrite Solar Cells", *IEEE*, 1985, p. 1429-1432.

Kapur, V.K., et al., "Low Cost Methods for the Production of Semiconductor Films for $CuInSe_2$/CdS Solar Cells", *Solar Cells*, 21, 1987, pp. 65-72.

Kim, et al., "Preparation of $CuInSe_2$ Thin Films Using Electrodeposited In/Cu Metallic Layer", *First WCPEC*, Dec. 5-9, 1994, Hawaii, *IEEE*, pp. 202-205.

Kumar, et al., "Properties of $CuInSe_2$ Films Prepared by the Rapid Thermal Annealing Technique", *Thin Solid Films*, 223, 1993, pp. 109-113.

Lokhande, C., et al., "Preparation of $CuInSe_2$ and $CuInS_2$ Films by Reactive Annealing in $H_2 Se_2$ or $H_2 S$", *Solar Cells,*, 21, 1987, pp. 215-224.

Prosini, P.P., et al., "Electrodeposition of Copper-Indium Alloy Under Diffusion-Limiting Current Control", *Thin Solid Films*, 288, 1996, pp. 90-94.

Taunier, S., et al., "$Cu(In,Ga)(S,Se)_2$ Solar Cells and Modules by Electrodeposition", *Thin Solid Films*, 480-481, 2005, pp. 526-531.

Wijesundera, R.P., et al., "Preparation of $CuInS_2$ Thin Films by Electrodeposition and Sulpherisation for Applications in Solar Cells", *Solar Energy Mats. & Solar Cells*, 81, 2004, pp. 147-154.

Zank, J., et al., "Electrochemical Codeposition of Indium and Gallium for Chalcopyrite Solar Cells", *Thin Solid Films*, 286, 1996, pp. 259-263.

Abou-Elfotouh, FA, et al., "Studies of the Electrical and Interface Properties of the Metal Contacts to $CuInSe_2$ Single Crystals", *J. Vac. Sci. Technol. A.*, 8(4), Jul./Aug. 1990, pp. 3251-3254.

Dey, S., et al., "Platinum Group Metal Chalcogenides", *Platinum Metals Rev.*, 48(1), 2004, pp. 16-29.

Ghosh, B., et al., "A Novel Back-Contacting Technology for $CuInSe_2$ Thin Films", *Semiconduct. Sci. Tech.*, 11, 1996, pp. 1358-1362.

Grindle, S.P., et al., "Preparation and Properties of $CuInS_2$ Think Films Produced by Exposing rf-Sputtered Cu-In Films to an $H_2S$ Atmosphere", *Appl. Phys. Lett*, 35(1) Jul. 1, 1979, pp. 24-26.

Hansen, et al., "Cu-Ga Copper Gallium", Constitution of Binary Alloys, $2^{nd}$ Ed., McGraw Hill Book Co, pp. 582-584, 1958,.

Huang, C.J., et al., "formation of $CuInSe_2$ Thin Films on Flexible Substrates by Electrodeposition (ED) Technique", *Solar Energy Mats. & Solar Cells*, 82, 2004, pp. 553-565.

Kadam, A., et al., "Study of Molybdenum Back Contact Layer to Achieve Adherent and Efficient CIGS2 Absorber Thin-Film Solar Cells", *J. Vac. Sci. Tech. A.*, 23(4), Jul./Aug. 2005, pp. 1197-1201.

Malmstrom, J., et al., "Enhanced Back Reflectance and Quantum Efficiency in $Cu(In,Ga) H_2 Se_2$ Thin Film Solar Cells with ZrN Back Reflector", *Appl. Phys. Letts.*, 85(13), Sep. 27, 2004, pp. 2634-2636.

Moons, E., et al., "Ohmic Contacts to $P-CuInSe_2$ Crystals", *J. of electron. Mats.*, 22(3), 1993, pp. 275-280.

Nelson, A., et al., "Formation of Schottky Barrier Height of Au Contacts to $CuInSe_2$", *J. Vac. Sci. Technol. A.*, 9(3), May/Jun. 1991, pp. 978-982.

Subramanian, PR et al., "The Cu-In (Copper-Indium) System", Bulletin of Alloy pHase Diagrams, vol. 10 No. 5, pp. 554-568 (1989).

\* cited by examiner

PRECURSOR CONTAINING COPPER INDIUM AND GALLIUM FOR SELENIDE (SULFIDE) COMPOUND FORMATION

CLAIM OF PRIORITY

This application claims priority to U.S. Provisional Application Ser. No. 60/756,750 filed Jan. 6, 2006, entitled Precursor Copper Indium And Gallium For Selenide (Sulfide) Compound Formation, and is a continuation-in-part of U.S. application Ser. No. 11/081,308 filed Mar. 15, 2005 entitled Technique And Apparatus For Depositing Thin Layers Of Semiconductors For Solar Cell Fabrication, now U.S. Pat. No. 7,374,963 the contents of which applications are incorporated herein by reference in their entirety.

BACKGROUND OF THE INVENTION

1. Field of the Invention

The present invention generally relates to solar cell fabrication. More particularly, the present invention relates to systems and methods for preparing metallic precursor thin films for the growth of semiconductor compounds to be used for radiation detector and solar cell fabrication.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. One way of reducing the cost of solar cell electricity generation is to develop low-cost thin film growth techniques that can deposit solar-cell-quality absorber materials on large area substrates and to fabricate these devices using high-throughput, low-cost methods.

Compounds of Copper (Cu), Indium (In), Gallium (Ga), Selenium (Se) and Sulfur (S) which are generally referred to as CIGS(S), or Cu(In,Ga)(S,Se)$_2$ or CuIn$_{1-x}$Ga$_x$(S$_y$Se$_{1-y}$)$_k$, where $0 \leq x \leq 1$, $0 \leq y \leq 1$ and k is approximately 2, have already been employed in solar cell structures that have yielded conversion efficiencies approaching 20%. The structure of a conventional CIGS(S) photovoltaic cell is shown in FIG. 1. A device 10 is fabricated on a substrate 11, such as a sheet of glass, a sheet of metal, an insulating foil or web, or a conductive foil or web. An absorber film 12, is a CIGS(S) layer and is grown over a conductive layer 13, which was previously deposited on substrate 11 and which acts as the electrical contact for device 10.

Various conductive layers comprising Molybdenum (Mo), Tantalum (Ta), Tungsten (W), Titanium (Ti), their nitrides and stainless steel have been used in the solar cell structure of FIG. 1. If substrate 11 itself is a properly selected conductive material, it is possible not to use conductive layer 13, since substrate 11 may then be used as the ohmic contact to device 10. After absorber film 12 is formed, a transparent layer 14 such as a Cadmium Sulfide (CdS), Zinc Oxide (ZnO) or CdS/ZnO stack is formed on absorber film 12.

Radiation 15 enters device 10 through transparent layer 14. Metallic grids (not shown) may also be deposited over transparent layer 14 to reduce the effective series resistance of device 10. The typical electrical type of absorber film 12 is p-type, and the typical electrical type of transparent layer 14 is n-type. However, an n-type absorber and a p-type window layer can also be utilized. The typical device structure of FIG. 1 is called a "substrate-type" structure. A "superstrate-type" structure can also be constructed by depositing a transparent conductive layer on a transparent superstrate such as glass or transparent polymeric foil, and then depositing the CIGS(S) absorber film, and finally forming an ohmic contact to the device by a conductive layer. In this superstrate structure light enters the device from the transparent superstrate side. A variety of materials, deposited by a variety of methods, can be used to provide the various layers of device 10 shown in FIG. 1.

In a thin film solar cell employing CIGS(S) absorber, the cell efficiency is a strong function of the molar ratio of Cu/(In+Ga). The Ga/(In+Ga) molar ratio also affects the performance of the solar cell. For good device performance Cu/(In+Ga) molar ratio is kept at or below 1.0. As the Ga/(Ga+In) molar ratio is increased, on the other hand, the optical bandgap of the absorber layer increases increasing the open circuit voltage of the solar cell. Consequently, it is desirous, but not required, for a thin film deposition process to have the capability of controlling the above mentioned molar ratios.

One prior art method described in U.S. Pat. No. 4,581,108 utilized an electro-deposition approach for metallic precursor preparation and reaction of the metallic precursor with Se to form the compound. In this method a Cu layer was first electrodeposited on a substrate. This was then followed by electro-deposition of an In layer and heating of the deposited Cu/In stack in a reactive atmosphere containing Se. It was claimed that, through this approach thickness of individual constituent layers is independently controlled providing good compositional control for the overall film. In practice, however, this technique was found to yield CuInSe$_2$ films with poor adhesion to the Mo contact layer. In a publication ("Low Cost Methods for the Production of Semiconductor Films for CuInSe2/CdS Solar Cells", *Solar Cells*, vol:21, p.65, 1987) electro-deposition and selenization of Cu/In and Cu/In/Ga layers were demonstrated for CIS and CIGS growth. One problem area was identified as peeling of the compound films. The cross-section of Mo/CuInSe$_2$ interface obtained by SEM clearly showed a weak interface.

Another conventional technique used for CIGS(S) formation involves sputter deposition of Cu—Ga alloy followed by sputter deposition of an In layer to obtain a (Cu—Ga alloy/In) precursor stack on the Mo back contact (see U.S. Pat. No. 6,092,669). The stack is then reacted with selenium and/or sulfur to form the compound. This approach has the drawback of high cost. Material utilization in a sputtering technique is much lower than 100% and Cu—Ga target preparation is costly.

Therefore, there is still a need to develop a cost effective approach to form high-quality, well-adhering Cu(In,Ga)(Se,S)$_2$ compound thin films with macro-scale as well as micro-scale compositional uniformities and Ga/(In+Ga) molar ratios in the range of 0.2-0.4.

SUMMARY OF THE INVENTION

The present invention relates to systems and methods for preparing metallic precursor thin films for the growth of semiconductor compounds to be used for radiation detector and solar cell fabrication.

In one aspect, there is provided a method of efficiently using expensive materials necessary for the making of solar cells.

In a particular aspect, there is provided a method of forming a Cu(In,Ga)(S,Se)2 semiconductor layer on a base. The method requires growing a conductive layer on a substrate thus forming a base; depositing on the conductive layer a substantially metallic film comprising copper; electroplating a gallium film over the substantially metallic film; electroplating an indium film over the gallium film, thereby providing a precursor stack that has an indium-rich top surface with a melting temperature of higher than that of gallium; and reacting the precursor stack with at least one of selenium and sulfur.

In another particular aspect, there is provided a method of forming a Cu(In,Ga)(S,Se)2 semiconductor layer on a base including depositing a first film comprising only copper on the base using a physical vapor deposition method; electroplating a layer consisting of indium and gallium over the copper film, thus forming a precursor stack; and reacting the precursor stack with at least one of selenium and sulfur.

BRIEF DESCRIPTION OF THE DRAWINGS

Aspects and features of the present invention will become apparent to those ordinarily skilled in the art from the following detailed description of embodiments of the invention in conjunction with the accompanying drawings, wherein.

DETAILED DESCRIPTION OF THE INVENTION

Figure 1:
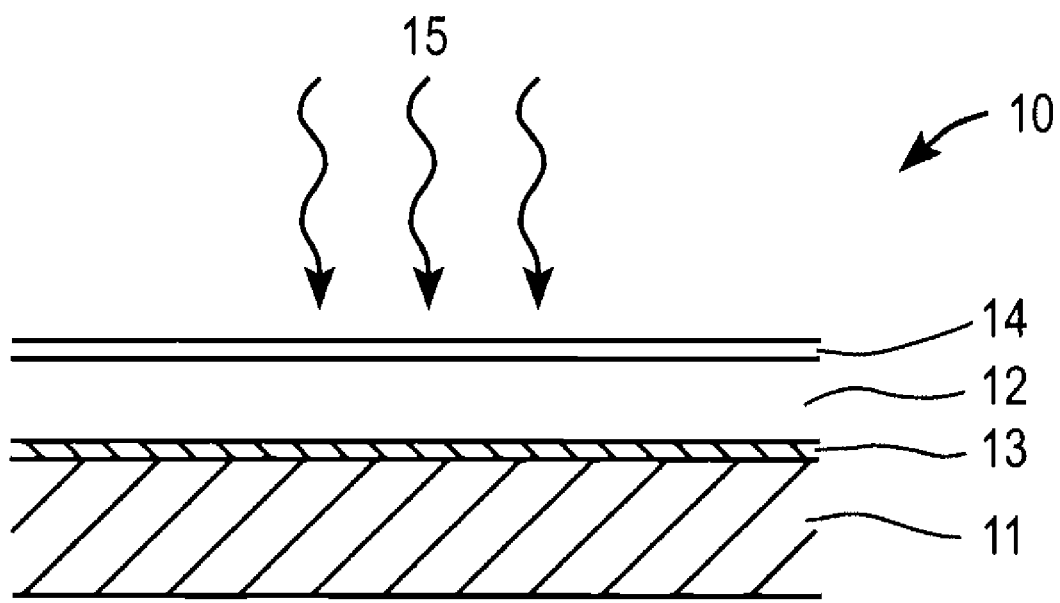
FIG. 1 illustrates a conventional cross-sectional view of a solar cell employing a Group IBIIIAVIA absorber layer.

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Copper is the least expensive of the metallic materials used for the formation of a CIGS(S) compound layer. Copper can be deposited controllably using physical vapor deposition (PVD) methods such as evaporation and sputtering. Evaporation can be carried out by filament evaporation or e-beam evaporation. Sputtering is attractive because copper can be easily machined and therefore either rectangular (planar) or cylindrical sputtering targets can be easily manufactured at low cost. Use of cylindrical magnetron sputtering can improve materials utilization which may be about 40-50% for standard planar magnetron sputtering.

Indium and gallium are expensive materials and especially Ga sputtering is difficult because of its low melting point. Targets melt due to Argon (Ar) bombardment during sputtering. Using melt to sputter Ga is not attractive because it limits the geometry to a "sputter-up" configuration. This is one of the reasons why Ga has been included into the Cu sputtering target in prior art approaches by forming Cu—Ga alloy targets as discussed above. Formation of Cu—Ga alloy targets, however, is costly poor materials utilization of the PVD methods would still waste Ga if Cu—Ga alloy material is used in a PVD process such as sputtering.

Certain embodiments of the present invention utilize a PVD method for the deposition of the low cost component of the compound, i.e. copper, and uses electro-deposition for the expensive components, i.e. In and Ga. In this way, adhesion and nucleation challenges for electroplating Cu on the contact layer such as Mo can be avoided, and also near 100% materials utilization of electro-deposition provides important cost advantages for the deposition of the expensive Ga and In.

Certain embodiments of the present invention will now be described using the following two examples, which are not meant to limit the scope of the invention.

EXAMPLE 1

An acidic indium plating electrolyte was prepared using sulfamate chemistry. The electrolyte contained about 100 grams of indium metal. Sulfumic acid was used to adjust the pH to about 2. A basic Ga plating solution was also prepared using 1M gallium chloride and adjusting the pH to about 14 using potassium hydroxide. Platinum (Pt) mesh was used as the anode for all depositions.

A glass substrate/Molybdenum (Mo) was used as the base. Mo layer was sputter deposited on the glass surface to a thickness of about 0.7 um. A Cu layer was then deposited by sputtering to a thickness of about 2000 A. Copper deposition by PVD was followed by electro-deposition of a Ga layer from the above solution to a thickness of about 950 A using a current density of about 10 mA/cm2. This was then followed by electro-deposition of In to a thickness of about 3800 A at a current density of about 20 mA/cm2. Gallium electro-deposition efficiency was determined to be at least about 70%, and In electro-deposition efficiency was at least about 90%. All layers were well adhering and stable. It should be understood that electroplating efficiency cited here refers to metal plating efficiency with respect to hydrogen gas evolution. It does not refer to materials utilization, which is always close to 100% in electroplating, because whatever material is not plated stays in the solution to be plated onto the next substrate.

EXAMPLE 2

The above experiment was repeated, however, this time Cu layer was electro-deposited onto the Mo surface using a copper sulfate electrolyte containing about 150 grams/liter of copper sulfate penta hydrate and about 10 grams/liter of sulfuric acid. It was observed that when Ga electro-deposition was carried out on this electroplated Cu layer, deposition efficiency was much lower (e.g., less than about 30%) and the film was not very continuous.

The above work demonstrated feasibility of electrodepositing Ga and In on PVD deposited Cu layer so that a precursor stack containing Cu, In and Ga is obtained. Also it is demonstrated that Cu, In and Ga amounts in this stack can be varied at will to obtain the desired Cu/(In+Ga) and Ga/(In+Ga) molar ratios for best solar cell efficiency. To form the compound layer, the precursor stacks of this invention may be reacted with Se and/or S in various ways. One approach is to deposit a Se layer on the precursor stack to form a composite layer and then heat the composite layer to about 400-550 C to form the selenide. Other approaches involve reaction with gases such as hydrogen selenide and hydrogen sulfide. The precursor stack of Example 1, once reacted, would form a CIGS(S) compound film with a Cu/(In+Ga) ratio of about 0.87 and Ga/(Ga+In) ratio of about 0.25.

As can be seen from Examples 1 and 2 above, Ga deposition can be more efficient and better quality when carried out on a PVD deposited Cu layer compared to electroplated Cu layers. This is an unexpected result. It should be noted that since the contact layer, such as Mo, is traditionally deposited by PVD approaches such as sputtering, the Cu layer may also be deposited in the same PVD equipment during a single pump-down. In other words, if sputtering is used, for example, two different targets may be utilized and the substrate may travel from the Mo target to the Cu target yielding a Mo/Cu structure in one pump-down and process step.

In certain embodiments of the present invention, it is possible to deposit the Ga and In layers in the form of an alloy. In other words, after PVD of the Cu layer, an electrolyte comprising both In and Ga may be used to electroplate an In—Ga alloy or mixture layer over the PVD Cu layer to form a precursor stack. This stack is then reacted with Se and/or S to form the CIGS(S) compound film. Since both In and Ga are electroplated in this case also, the cost advantages and other benefits of certain aspects of the invention are preserved.

Figure 2:
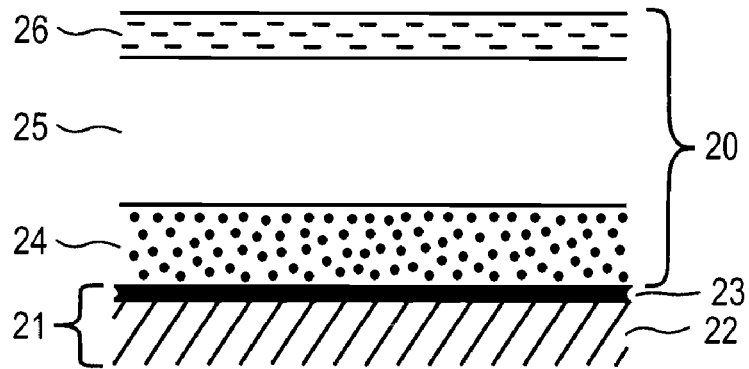
FIG. 2 illustrates a metallic precursor stack of Cu/In/Ga according to certain embodiments of the present invention.

FIG. 2, represents a Cu/In/Ga stack 20 deposited on a base 21 comprising a substrate 22 and a contact layer 23 such as Mo. Copper sub-layer 24 is first deposited on contact layer 23. This is followed by deposition of an In sub-layer 25 and a Ga sub-layer 26. Assuming a desirable Cu/(In+Ga) molar ratio of 0.95 and a Ga/(In+Ga) ratio of 0.25, the thicknesses of Cu, In and Ga sub-layers would be approximately 2000 A, 3500 A, and 870 A, respectively, to obtain an approximately 2-3 micron thick CIGS(S) compound film after reaction of the precursor stack with Se and/or S. As can be seen in FIG. 2, the Cu/In/Ga stack has a thin Ga sub-layer 26 at the top of the stack 20. Gallium is a low melting material and it has a eutectic with In (at about 16% In composition) that melts at about 16 C. Therefore, the surface of stack 20 in FIG. 2 is vulnerable to temperature and forms nodules and rough morphology in a short period of time.

Figure 3:
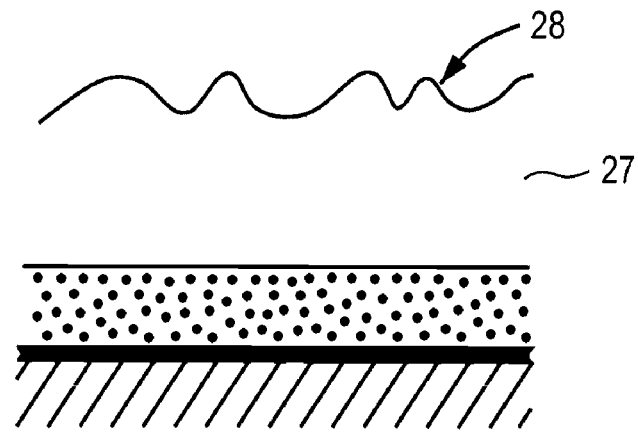
FIG. 3 illustrates the stack of FIG. 2 after its surface becomes rough due to Ga/In mixing at the top surface according to certain embodiments of the present invention.

This is depicted in FIG. 3 which shows that the top of In sub-layer 25 and Ga sub-layer 26 are intermixed to form a film 27 with a Ga-rich and rough surface 28. The surface balling or roughening may happen at room temperature, as mentioned above, once about 16% In intermixes with the top Ga-sub layer. It may also happen during a subsequent heating step that may be used for selenization/sulfidation process. Alternately, it may even happen during deposition of Ga or during deposition of a Se film over the stack 20, before the reaction step. Rough surface and balling such as the one shown in FIG. 3 present a problem because it causes micro-scale compositional non-uniformity in the film 27. Especially Ga distribution near the surface 28 is very non-uniform in such a film. Such micro-scale compositional and morphological non-uniformities are transferred into the CIGS(S) compound layers once reaction with Se and/or S is completed. Such non-uniformities lower the efficiency of solar cells fabricated on such compound layers.

Figure 4:
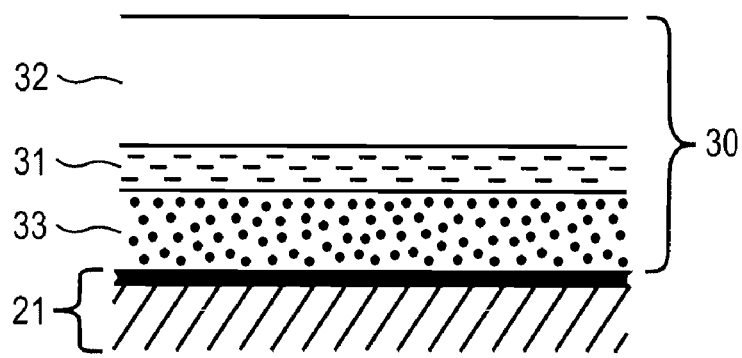
FIG. 4 illustrates a precursor stack comprising Cu/Ga/In according to certain embodiments of the present invention.

FIG. 4 shows the improved stack 30 of certain embodiments of the present invention. In this case a Ga film 31 is deposited on a Cu film 33, and In film 32 is deposited over Ga film 31. This way the low melting phases of Ga and Ga—In alloy is trapped under a relatively thick layer of In which has a melting point of over 150 C. The surface of this improved stack is smooth at least up to about 150 C, and no micro-scale non-uniformity is allowed by the presence of the In film 32, which acts as a cap.

Although the improved stack of FIG. 4 can be obtained by various techniques such as sputtering and evaporation, use of electro-deposition to form this stack is favored because electro-deposition can be carried out cold and therefore Ga can be kept solid as the In film is deposited over it by electroplating and the Ga/In interface can be kept abrupt during deposition without much intermixing. Indium deposition solution may be at room temperature or may even be chilled to 10-15 C to aid in this result. In evaporation and sputtering techniques, however, vaporized material has high kinetic energy and when it arrives onto the substrate that energy partially turns into heat. Therefore, if for example In is evaporated on a Ga layer, even if the substrate is kept at room temperature, arriving In vapor would introduce local heat to the Ga film and cause In—Ga intermixing early during In deposition. As mentioned before, with about 16% In arriving onto the Ga film, the eutectic would form, melt and cause balling. Rest of the In layer would then continue growing in a non-uniform manner over the liquefied alloy layer. These non-uniformities are transferred into the compound film after reaction with Se and/or S and cause lower device efficiencies once solar cells are fabricated on the compound film.

Although the present invention has been particularly described with reference to embodiments thereof, it should be readily apparent to those of ordinary skill in the art that various changes, modifications, substitutes and deletions are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of inventive elements illustrated and described in the above figures. It is intended that the scope of the appended claims include such changes and modifications.

What is claimed is:

1. A method of forming a Cu(In,Ga)(S,Se)2 semiconductor layer on a base comprising;
    growing a conductive layer on a substrate thus forming a base;
    depositing on the conductive layer a substantially metallic film comprising copper;
    electroplating a gallium film over the substantially metallic film;
    electroplating an indium film over the gallium film, thereby providing a precursor stack that has an indium-rich top surface with a melting temperature of higher than that of gallium, wherein the step of electroplating the indium film is carried out at a temperature below the melting temperature of gallium; and
    reacting the precursor stack with at least one of selenium and sulfur.

2. The method according to claim 1 wherein the conductive layer comprises Mo and the step of depositing uses a physical vapor deposition technique.

3. The method according to claim 2 wherein the substantially metallic film is a pure copper film.

4. The method according to claim 3 wherein the physical vapor deposition technique is sputtering.

5. The method according to claim 1 wherein the step of depositing uses electroplating.

6. The method according to claim 5 wherein the substantially metallic film is a pure copper film.

7. The method according to claim 1 wherein during the step of electroplating the indium film, the gallium film maintains a solid form.

8. The method according to claim 1 wherein the step of electroplating the indium film is carried out at a bath temperature of 10-15° C.

* * * * *